US010446516B2

(12) United States Patent
Yen et al.

(10) Patent No.: US 10,446,516 B2
(45) Date of Patent: Oct. 15, 2019

(54) SEMICONDUCTOR PACKAGE STRUCTURE

(71) Applicant: Realtek Semiconductor Corporation, Hsinchu (TW)

(72) Inventors: Hsiao-Tsung Yen, Hsinchu (TW); Ping-Yuan Deng, Taoyuan (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 56 days.

(21) Appl. No.: 15/877,400

(22) Filed: Jan. 23, 2018

(65) Prior Publication Data
US 2018/0261565 A1    Sep. 13, 2018

(30) Foreign Application Priority Data
Mar. 8, 2017    (TW) .............................. 106107634 A

(51) Int. Cl.
*H01L 23/66* (2006.01)
*H01L 23/00* (2006.01)

(52) U.S. Cl.
CPC .............. *H01L 24/49* (2013.01); *H01L 23/66* (2013.01); *H01L 24/43* (2013.01); *H01L 2224/48465* (2013.01); *H01L 2224/494* (2013.01); *H01L 2224/49175* (2013.01); *H01L 2224/49431* (2013.01); *H01L 2924/00014* (2013.01); *H01L 2924/381* (2013.01)

(58) Field of Classification Search
CPC ... H01L 24/49; H01L 24/43; H01L 2924/381; H01L 2224/494; H01L 2224/49-49505; H01L 2224/49051; H01L 2224/49052; H01L 2224/4909; H01L 2224/49174; H01L 2224/49175; H01L 2224/49176; H01L 2224/49177
See application file for complete search history.

(56) References Cited

U.S. PATENT DOCUMENTS

| 6,476,506 | B1 * | 11/2002 | O'Connor | ......... H01L 23/49838 |
| | | | | 257/576 |
| 6,812,580 | B1 * | 11/2004 | Wenzel | .................. H01L 23/50 |
| | | | | 257/691 |
| 7,303,113 | B2 * | 12/2007 | Kwark | .................... H01L 23/66 |
| | | | | 228/180.5 |
| 7,456,505 | B2 * | 11/2008 | Gospodinova | .......... H01L 23/13 |
| | | | | 257/784 |
| 8,664,774 | B1 * | 3/2014 | Mosinskis | ............. H01L 23/552 |
| | | | | 257/734 |
| 2005/0017352 | A1 * | 1/2005 | Lee | ........................ H01L 23/66 |
| | | | | 257/728 |
| 2005/0263793 | A1 * | 12/2005 | Cornelius | ......... H01L 23/49816 |
| | | | | 257/200 |

(Continued)

FOREIGN PATENT DOCUMENTS

CN        1677666 A    10/2005
CN      101673689 A     3/2010

*Primary Examiner* — Scott B Geyer
(74) *Attorney, Agent, or Firm* — CKC & Partners Co., LLC

(57) ABSTRACT

A semiconductor package structure is disclosed. The semiconductor package structure comprises a plurality of layered structures, a plurality of wires, and a first ring structure. The wires are connected to each of the layered structures. The first ring structure is coupled to at least one of the layered structures and positioned between the wires.

16 Claims, 4 Drawing Sheets

(56) References Cited

U.S. PATENT DOCUMENTS

| | | | | |
|---|---|---|---|---|
| 2008/0191330 A1* | 8/2008 | Hung | ............... | H01L 23/4952 |
| | | | | 257/676 |
| 2009/0273074 A1 | 11/2009 | Li | | |
| 2011/0273154 A1* | 11/2011 | Satou | ............... | H01L 23/49575 |
| | | | | 323/282 |
| 2014/0346637 A1* | 11/2014 | Komposch | ............ | H01L 23/047 |
| | | | | 257/532 |
| 2015/0381135 A1 | 12/2015 | Tsai et al. | | |
| 2016/0113159 A1 | 4/2016 | Yen et al. | | |

* cited by examiner

SEMICONDUCTOR PACKAGE STRUCTURE

CROSS-REFERENCE TO RELATED APPLICATION

This application claims the priority benefit of TAIWAN Application serial no. 106107634, filed Mar. 8, 2017, the full disclosure of which is incorporated herein by reference.

FIELD OF INVENTION

The invention relates to a semiconductor package structure. More particularly, the invention relates to a semiconductor package structure for reducing the coupling effect by ring structures.

BACKGROUND

With advances in technology and consumer demand for light and small electronic devices, the volume of electronic components is diminishing, but the semiconductor package structures have complex wire layouts. The wires are getting closer and closer, coupling effect occurs often, and the performances of the electronic components are affected. Many methods have been proposed to reduce the coupling effect between the wires, such as increasing the ground bonding wires. However, this method requires additional chip space or pins.

Therefore, how to reduce the coupling effect between the wires without adding additional chip space or pins is one of the problems to be improved in the field.

SUMMARY

An aspect of this disclosure is to provide a semiconductor package structure. The semiconductor package structure comprises a plurality of layered structures, a plurality of wires, and a first ring structure. The wires are connected to each of the layered structures. The first ring structure is coupled to at least one of the layered structures and positioned between the wires.

Another aspect of this disclosure is to provide a semiconductor package structure. The semiconductor package structure comprises a chip, at least one pin, a ground layer, a plurality of first wires, a plurality of second wires, and a third wire. The ground layer is positioned between the chip and the at least one pin. The first wires are coupled to the chip and the at least one pin. The second wires are coupled to the chip and the ground layer. The third wire comprises two end points. The two end points are coupled to at least one of the ground layer and the chip respectively to form a first ring structure, and the third wire is positioned between the first wires and the second wires.

The embodiment of the present disclosure is to provide a semiconductor package structure, and in particular, a semiconductor package structure for reducing the coupling effect by ring structures, so as to reduce the coupling effect between the wires without increasing additional chip space or pins.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
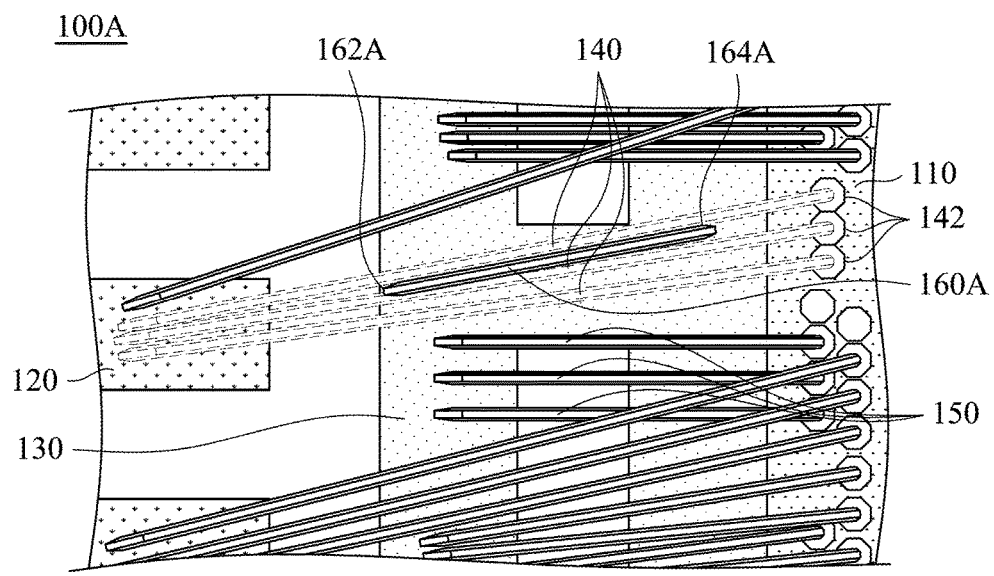
FIG. 1A is a schematic diagram illustrating a semiconductor package structure according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention.

FIG. 1A is a schematic diagram illustrating a semiconductor package structure 100A according to some embodiments of the present disclosure. As illustrated in FIG. 1A, the semiconductor package structure 100A includes several layered structures, several wires and a first ring structure. The semiconductor package structure 100A is for illustrative purposes only, and the present disclosure is not limited thereto.

Reference is made to FIG. 1A. The layered structures are connected by wires. For example, the layered structures include a chip 110, pins 120 and a ground layer 130. The ground layer 130 is positioned between the chip 110 and the pins 120. The first wires 140 connect the chip 110 and the pins 120, and the second wires 150 connect the chip 110 and the ground layer 130. In some embodiments, the first wires 140 and the second wires 150 are respectively connected to the chip 110 through the pads 142. When the semiconductor element is operated, the coupling effect is generated between the first wires 140 and the second wires 150. When the first wires 140 are parallel to the second wires 150, the coupling effect is maximized.

As illustrated in FIG. 1A, the first ring structure is coupled to at least one of the layered structures and is positioned between the wires. For example, the first ring structure includes a third wire 160A and a ground layer 130. In the connecting relation, the first end 162A and the second end 164A of the third wire 160A are respectively coupled to the ground layer 130. The ring structure is formed by starting from the first end 162A of the third wire 160A, through the third wire 160A to the second end 164A of the third wire 160A, and then from the second end 164A, through the ground layer 130, back to the first end 162A. As shown in FIG. 1A, the third wire 160A is positioned between or on the first wires 140.

Figure 1B:
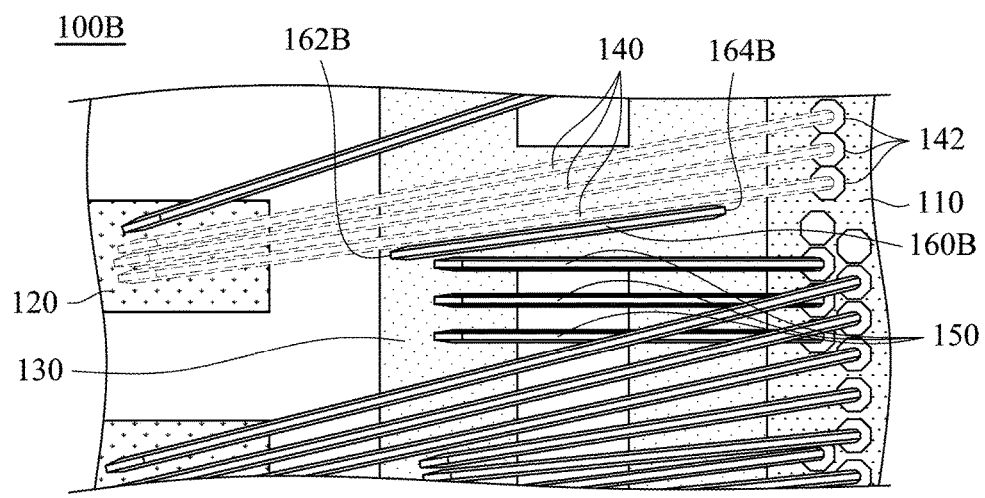
FIG. 1B is a schematic diagram illustrating a semiconductor package structure according to some embodiments of the present disclosure.

FIG. 1B is a schematic diagram illustrating a semiconductor package structure 100B according to some embodiments of the present disclosure. FIG. 1B is similar to FIG. 1A, and only the arrangement of the third wire 160B is different. In FIG. 1A, the third wire 160A is positioned between the first wires 140, and in FIG. 1B, the third wire 160B is positioned between the first wires 140 and the second wires 150. As shown in FIG. 1B, the first end 162B and the second end 164B of the third wire 160B are respectively coupled to the ground layer 130, and the third wire 160B is positioned between the first wires 140 and the second wires 150.

Figure 1C:
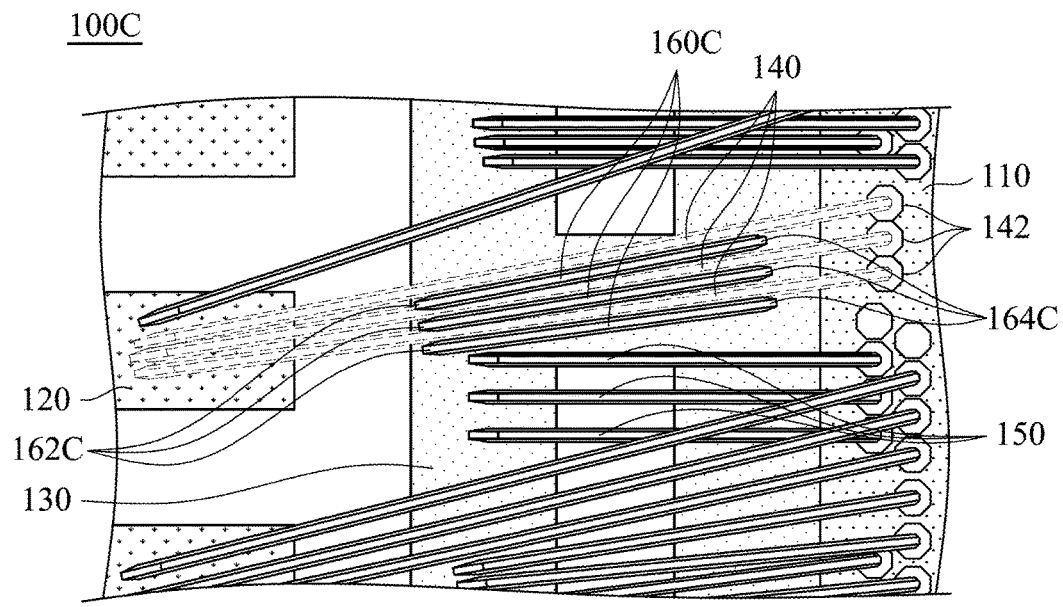
FIG. 1C is a schematic diagram illustrating a semiconductor package structure according to some embodiments of the present disclosure.

FIG. 1C is a schematic diagram illustrating a semiconductor package structure 100C according to some embodiments of the present disclosure. FIG. 1C is similar to FIG. 1A, and only the number of the third wires 160C is different. In FIG. 1A, there is one third wire 160A, and in FIG. 1C, there are three third wires 160C. FIG. 1A and FIG. 1C are merely illustration of the partial implementation of present disclosure, and the present disclosure is not limited thereto. As shown in FIG. 1C, three third wires 160C respectively form a ring structure with the ground layer 130. In the connecting relation, the first ends 162C and the second ends 164C of the three third wires 160C are respectively coupled to the ground layer 130, and the third wires 160C are respectively positioned between the first wires 140, between the first wires 140 and the second wires 150, or on the first wires 140 and the second wires 150. In some embodiments, the third wires 160C are parallel to each other.

Figure 1D:
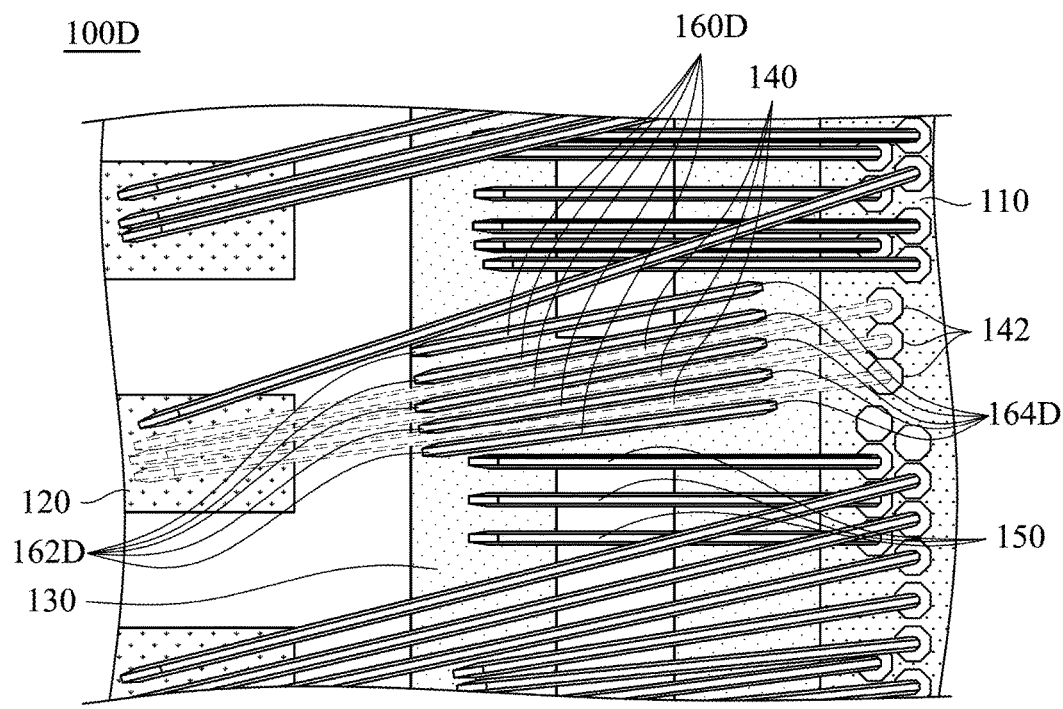
FIG. 1D is a schematic diagram illustrating a semiconductor package structure according to some embodiments of the present disclosure.

FIG. 1D is a schematic diagram illustrating a semiconductor package structure 100D according to some embodiments of the present disclosure. FIG. 1D is similar to FIG. 1C, and only the number of the third wires 160C is different. In FIG. 1C, there are three third wires 160C, and in FIG. 1D, there are five third wires 160D. FIG. 1C and FIG. 1D are merely illustration of the partial implementation of present disclosure, and the present disclosure is not limited thereto. As shown in FIG. 1D, the five third wires 160D respectively form a ring structure with the ground layer 130. In the connecting relation, the first end 162D and the second end 164D of the five third wires 160D are respectively coupled to the ground layer 130, and the third wires 160D are respectively positioned between the first wires 140, between the first wires 140 and the second wires 150, or on the first wires 140 and the second wires 150. In some embodiments of the present invention, the third wires 160D are parallel to each other.

In some embodiments of the present disclosure, the third wires 160A to 160D are parallel to the first wires 140 and/or the second wires 150.

Figure 2A:
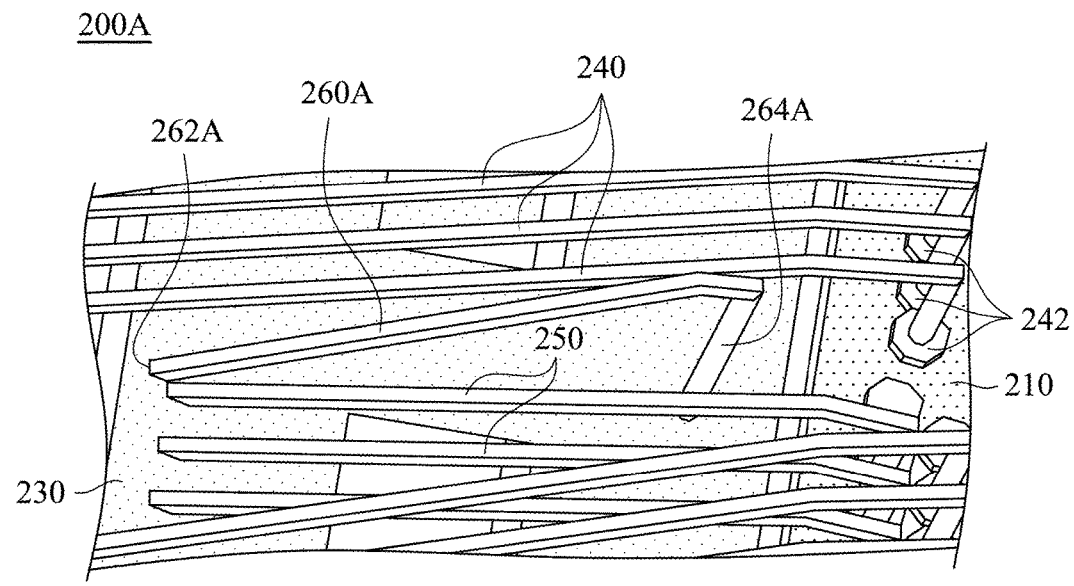
FIG. 2A is a side view diagram illustrating a semiconductor package structure according to some embodiments of the present disclosure.

FIG. 2A is a side view diagram illustrating a semiconductor package structure 200A according to some embodiments of the present disclosure. As illustrated in FIG. 2A, the semiconductor package structure 200A includes several layered structures, several wires, and a first ring structure. The semiconductor package structure 200A illustrated in FIG. 2A is for illustrative purposes only, and the present disclosure is not limited thereto.

Reference is made to FIG. 2A. The layered structures include a chip 210, pins (not shown), and a ground layer 230. The ground layer 230 is positioned between the chip 210 and the pins. The first wires 240 connect the chip 210 and the pins, and the second wires 250 connect the chip 210 and the ground layer 230. In one embodiment, the first wire 240 and the second wire 250 respectively connect to the chip 210 through the pads 242. When the semiconductor elements are operated, the coupling effect is generated between the first wires 240 and the second wires 250. When the first wires 240 are parallel to the second wires 250, the coupling effect is maximized.

As illustrated in FIG. 2A, the first ring structure is coupled to at least one of the layered structures and is positioned between the wires. For example, the first ring structure includes a third wire 260A and a ground layer 230. In the connecting structure, the first end 262A and the second end 264A of the third wire 260A are respectively coupled to the ground layer 230. In FIG. 2A, the third wire 260A is, but not limited to, positioned between the first wires 240 and the second wires 250.

Figure 2B:
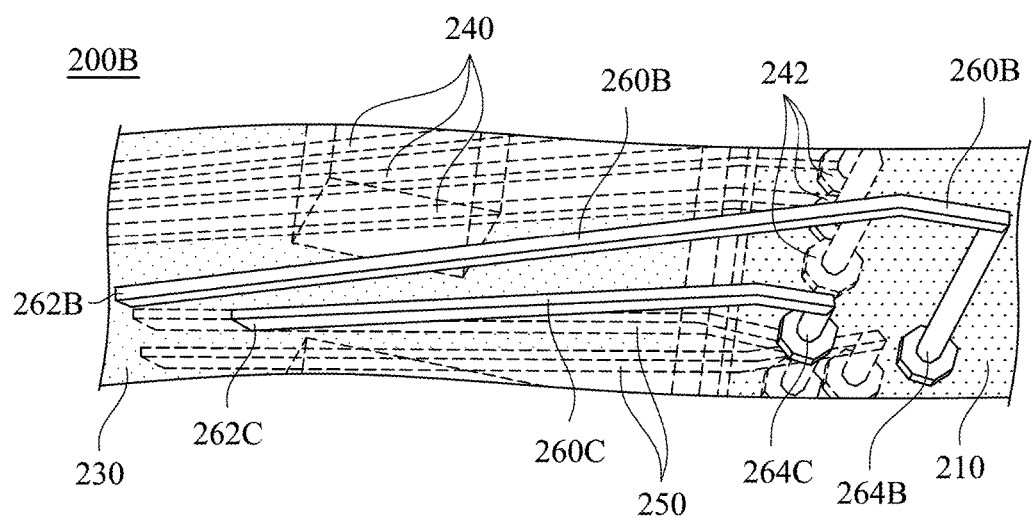
FIG. 2B is a side view diagram illustrating another semiconductor package structure according to some embodiments of the present disclosure.

FIG. 2B is a side view diagram illustrating another semiconductor package structure 200B according to some embodiments of the present disclosure. FIG. 2B is similar to FIG. 2A, and only the arrangement of the first ring structure is different. The semiconductor package structure 200B of FIG. 2B further includes the second ring structure formed by wires 260C, the ground layer 230, and the chip 210. The arrangement of the first ring structure is different in that in FIG. 2A, the first ring structure includes the third wire 260A and the ground layer 230, whereas in FIG. 2B, the first ring structure includes the third wire 260B, the ground layer 230, and the chip 210. In the connecting structure, the first end 262B and the second end 264B of the third wire 260B are respectively coupled to the ground layer 230 and the chip 210, and the first end 262C and the second end 264C of the fourth lead 260C are also respectively coupled to the ground layer 230 and the chip 210. In some embodiments of the present disclosure, the third wire 260B, the fourth wire 260C, the ground layer 230, and the chip 210 form a third ring structure. The third ring structure is formed by starting from the first end 262B of the third wire 260B, through the third wire 260B to the second end 264B of the third wire 260B, and the second end 264B of the third wire 260B couples to the second end 264C of the fourth wire 260C through the chip 210, and then start from the second end 264C of the fourth wire 260C, through the fourth wire 260C to the first end 262C of the fourth wire 260C, and the first end 262C of the fourth wire 260C couples to the first end 262B of the third wire 260B through the ground layer 230, and back to the first end 262B of the third wire 260B. In one embodiment, the third wire 260B and the fourth wire 260C are coupled to the chip 210 through the pads 242.

Figure 3:
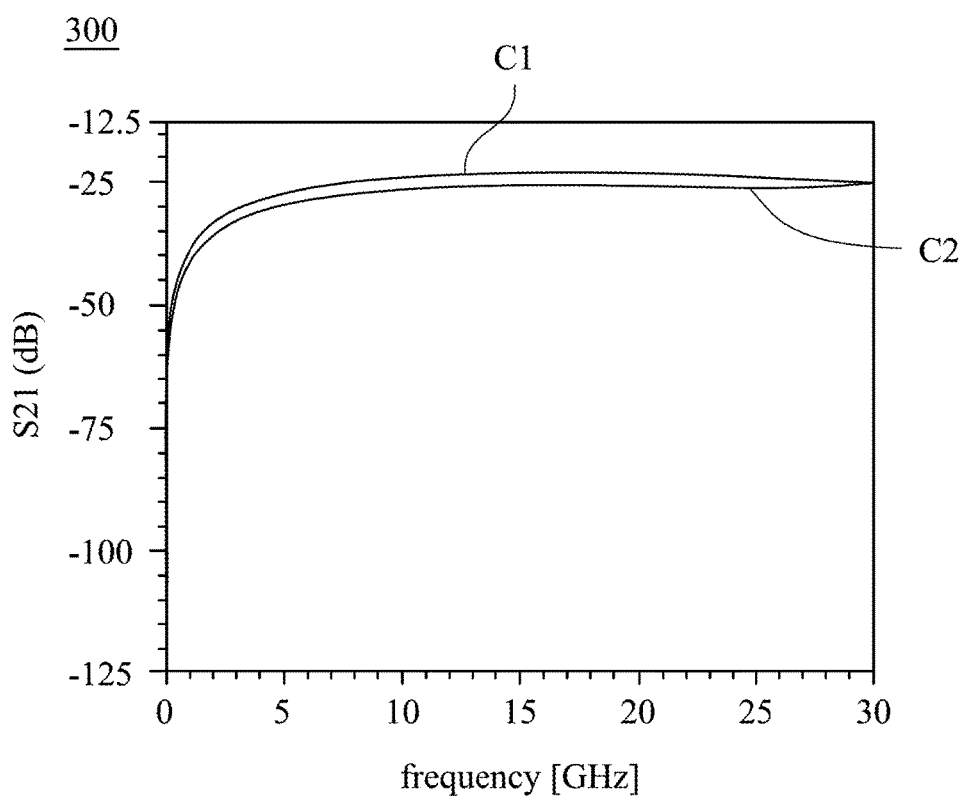
FIG. 3 is an experimental data diagram illustrating an experimental result of a semiconductor package structure according to some embodiments of the present disclosure.

FIG. 3 is an experimental data diagram illustrating an experimental result of a semiconductor package structure according to some embodiments of the present disclosure. This experimental data diagram is intended to illustrate the decibel (dB) size of the coupling effect (S21) between the first wires 140 and the second wires 150 at different frequencies. C1 is a graph of a semiconductor package structure without a ring structure, and C2 is a graph of a semiconductor package structure with a ring structure of the present disclosure. As shown in FIG. 3, the semiconductor package structure of the present disclosure may effectively reduce the coupling effect, and therefore, it is proved that the semiconductor package structure of the present embodiment may reliably reduce the coupling effect between the wires without increasing the extra chip space or the pins.

According to the embodiment of the present disclosure, it is understood that the embodiment of the present disclosure is to provide semiconductor package structure, and in particular, a semiconductor package structure for reducing the coupling effect by ring structures, so as to reduce the coupling effect between the wires without increasing additional chip space or pins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure, comprising:
   a plurality of layered structures;
   a plurality of wires configured for connecting each of the layered structures;
   a first ring structure coupled to at least one of the layered structures and positioned between the wires; and
   a second ring structure coupled to at least one of the layered structures and positioned between the wires;
   wherein the second ring structure is positioned below the first ring structure, and the first ring structure and the second ring structure form a third ring structure through at least one of the layers.

2. The semiconductor package structure of claim 1, wherein the first ring structure comprises a first wire and one of the layered structures.

3. The semiconductor package structure of claim 2, wherein a first end of the first wire and a second end of the first wire are respectively coupled to one of the layered structures.

4. The semiconductor package structure of claim 3, wherein one of the layered structures is a ground layer.

5. The semiconductor package structure of claim 2, wherein a first end of the first wire is coupled to one of the layered structures and a second end of the first wire is coupled to another one of the layered structures.

6. The semiconductor package structure of claim 5, wherein one of the layered structures is a ground layer, and another one of the layered structures is a chip.

7. The semiconductor package structure of claim 1, wherein the second ring structure is parallel to the first ring structure.

8. The semiconductor package structure of claim 1, wherein a first end of the second ring structure is coupled to a first end of the first ring structure through one of the layered structures.

9. The semiconductor package structure of claim 8, wherein a second end of the second ring structure is coupled to a second end of the first ring structure through another one of the layered structures.

10. The semiconductor package structure of claim 1, wherein the first ring structure is parallel to at least one of the wires.

11. A semiconductor package structure, comprising:
    a chip;
    at least one pin;
    a ground layer positioned between the chip and the at least one pin;
    a plurality of first wires coupled to the chip and the at least one pin;
    a plurality of second wires coupled to the chip and the ground layer;
    a third wire comprising two end points, wherein the two end points are respectively coupled to at least one of the ground layer and the chip to form a first ring structure, wherein the third wire is positioned between the first wires and the second wires; and
    a fourth wire comprising two end points, wherein the two end points are respectively coupled to at least one of the ground layer and the chip to form a second ring structure, wherein the fourth wire is positioned between the first wires and the second wires; and
    wherein the second ring structure is positioned under the first ring structure, and the first ring structure and the second ring structure form a third ring structure through at least one of the ground layer and the chip.

12. The semiconductor package structure of claim 11, wherein a first end of the third wire and a second end of the third wire are respectively coupled to the ground layer.

13. The semiconductor package structure of claim 11, wherein a first end of the third wire is coupled to the ground layer and a second end of the third wire is coupled to the chip.

14. The semiconductor package structure of claim 11, wherein the second ring structure and the first ring structure are parallel to each other.

15. The semiconductor package structure of claim 11, wherein a first end of the second ring structure is connected to a first end of the first ring structure.

16. The semiconductor package structure of claim 11, wherein the first ring structure is parallel to at least one of the first wires and the second wires.

* * * * *